United States Patent
Kim

(10) Patent No.: US 6,339,004 B1
(45) Date of Patent: Jan. 15, 2002

(54) METHOD OF FORMING SHALLOW TRENCH ISOLATION FOR PREVENTING TORN OXIDE

(75) Inventor: Sang-Hyun Kim, Seoul (KR)

(73) Assignees: AnAm Semiconductor Inc., Seoul (KR); AmKor Technology, Inc., Chandler, AZ (US)

( * ) Notice: Subject to any disclaimer, the term of this patent is extended or adjusted under 35 U.S.C. 154(b) by 0 days.

(21) Appl. No.: 09/523,372

(22) Filed: Mar. 10, 2000

(30) Foreign Application Priority Data

Mar. 25, 1999 (KR) .............................. 99-10290

(51) Int. Cl.⁷ ..................... H01L 21/336; H01L 21/76
(52) U.S. Cl. .................... 438/296; 438/404; 438/424; 438/425
(58) Field of Search .................... 438/296, 404, 438/424, 425

(56) References Cited

U.S. PATENT DOCUMENTS

| | | | |
|---|---|---|---|
| 4,404,236 A | * | 9/1983 | Komatsu et al. |
| 6,040,231 A | * | 3/2000 | Wu |
| 6,046,106 A | | 4/2000 | Tran et al. .................. 438/660 |
| 6,074,927 A | * | 6/2000 | Kepler et al. |
| 6,165,854 A | * | 12/2000 | Wu |
| 6,177,332 B1 | * | 1/2001 | Chen et al. |
| 6,251,735 B1 | * | 6/2001 | Lou |
| 6,277,706 B1 | * | 8/2001 | Ishikawa |

FOREIGN PATENT DOCUMENTS

JP       57-154855     *   9/1982
JP       62-151047     *   12/1986

OTHER PUBLICATIONS

Bothra et al., "Integration of 0.25 μm Three and Five Level Interconnect System For High Performance ASIC", Proceedings Fourteenth International VLSI Multilevel Interconnection Conference, Jun. 1997, pp. 5, 43–48.

Liu et al., "Integrated HDP Technology for Sub–0.25 Micron Gap Fill", Proceedings Fourteenth International VLSI Multilevel Interconnection Conference, Jun. 1997, pp. 618–619, 695.

Nguyen et al., "Characterization of High Density Plasma Deposited Silicon Oxide Dielectric For 0.25 Micron ULSI", Proceedings Twelfth International VLSI Multilevel Interconnection Conference, Jun. 1995, pp. 5, 59–75.

(List continued on next page.)

*Primary Examiner*—John F. Niebling
*Assistant Examiner*—Josetta I. Jones

(57) ABSTRACT

A method of forming a trench for semiconductor device isolation includes the steps of making a trench at a device isolation area of a silicon wafer by etching the silicon wafer and within through a mask pattern, forming a liner oxide on the silicon wafer with the trench through thermal oxidation, forming a nitride on the liner oxide through low pressure chemical vapor deposition, and anisotropically dry-etching the nitride such that the nitride is left only at the sidewalls of the trench. A trench-filling oxide is then deposited onto the entire surface of the silicon wafer through high pressure chemical vapor deposition, and annealed. The trench-filling oxide is planarized through chemical mechanical polishing until the top surface of the trench-filling oxide is positioned slightly over the liner oxide on the silicon wafer. The silicon wafer is then wet-cleaned, and thermally oxidized such that a pad oxide is grown at the surface of the silicon wafer.

9 Claims, 4 Drawing Sheets

OTHER PUBLICATIONS

Saikawa et al., "High Density Plasma CVD For 0.3 µm Device Application", Proceedings Thirteenth International VLSI Multilevel Interconnection Conference, Jun. 1996, pp. 5, 69–74.

Schwartz et al., "Chemical Vapor Deposition Reactors", *Handbook of Semiconductor Interconnection Technology*, 1998, Chapter I, Section 3.3, pp. vii, 6–9.

Wang et al., "Process Window Characterization of Ultima HDP–CVD™", Proceedings Third International Dielectrics For ULSI Multilevel Interconnection Conference (DUMIC), Feb. 1997, pp. 5–7, 405–408.

* cited by examiner

METHOD OF FORMING SHALLOW TRENCH ISOLATION FOR PREVENTING TORN OXIDE

BACKGROUND OF THE INVENTION (a) Field of the Invention

The present invention relates to a method of forming a trench for semiconductor device isolation and, more particularly, to a method of forming a shallow trench for semiconductor device isolation which exhibits good performance characteristics, and is well adapted for serving in device miniaturization.

(b) Description of the Related Art

Generally, a local oxidation of silicon (LOCOS) technique has been used for device isolation purpose in the semiconductor fabrication process.

In the LOCOS technique, the silicon wafer itself is thermally oxidized while using a nitride for a mask, and requires only a small number of processing steps. For this reason, the resulting oxide involves lower degree of stress, and exhibits good insulating characteristics.

However, in the application of the LOCOS technique, the device isolation area takes a large volume that limits device miniaturization as well as involves occurrence of the so-called bird's beak.

In order to solve the above problems, a shallow trench isolation (STI) technique has been suggested.

In the STI technique, a shallow trench is made in the silicon wafer, and filled with an insulating material. In this structure, the device isolation area is small, and hence the resulting trench can be well adapted for device miniaturization.

FIGS. 1A to 1D schematically illustrate the steps of processing a trench for device isolation according to a prior art.

As shown in FIG. 1A, a silicon wafer 1 is thermally oxidized so that a pad oxide 2 with a thickness of 100–200 Å is grown at the silicon wafer 1. A nitride 3 with a thickness of 1000–2000 Å is deposited onto the pad oxide 2 through low pressure chemical vapor deposition (LPCVD). The pad oxide 2 and the nitride 3 are patterned through photolithography, and the exposed silicon wafer 1 is etched such that a shallow trench is formed at the device isolation area.

As shown in FIG. 1B, the silicon wafer 1 is thermally oxidized so that a liner oxide 4 is grown at the inner wall of the trench. A trench-filling oxide 5 with a thickness of 8000–11000 Å is deposited onto the entire surface of the silicon wafer 1 through atmospheric chemical vapor deposition (APCVD) such that the trench is completely buried by the trench-filling oxide 5. The silicon wafer 1 is then annealed at 900–1000 ° C. for 20–50 minutes under a nitrogen gas ($N_2$) atmosphere to thereby density the trench-filling oxide 5.

As shown in FIG. 1C, the densified trench-filling oxide 5 is patterned through photolithography such that it is left only at the trench area.

As shown in FIG. 1D, the trench-filling oxide 5 at top side of the trench is removed through chemical mechanical polishing (CMP) while utilizing the nitride 3 as a stopping layer during the polishing. That is, the trench-filling oxide 5 is planarized such that the top portion of the trench-filling oxide 5 is level with the nitride 3. In this way, the formation of a shallow trench for device isolation is completed.

However, the above-described trench formation technique bears complicated processing steps. Furthermore, when the trench-filling oxide 5 is planarized through the CMP, the top edge portion of the trench-filling oxide 5 cracks so that the trench-filling oxide 5 remaining after the planarization is torn (usually called the "torn oxide"), causing serious device failures.

Furthermore, among the impurities used in the CMOS transistor, boron-like components that exhibit a high diffusion property at high temperatures are diffused toward the trench during annealing or thermal oxidation and can induce an electrical short or leakage, deteriorating device reliability.

SUMMARY OF THE INVENTION

It is an object of the present invention to provide a method of forming a trench for device isolation which has simplified processing steps, avoids the torn oxide phenomenon, and ensures device reliability.

These and other objects may be achieved by a method of forming a trench for semiconductor device isolation including the following steps. A trench is first made at a device isolation area of a silicon wafer by etching the silicon wafer through a mask pattern. A liner oxide is then formed on the silicon wafer and within the trench through thermal oxidation, and a nitride layer is formed on the liner oxide through low pressure chemical vapor deposition. The nitride is anisotropically dry-etched such that the nitride is left only at the sidewall of the trench. A trench-filling oxide is then deposited onto the entire surface of the silicon wafer through high pressure chemical vapor deposition, and annealed. The trench-filling oxide is planarized through chemical mechanical polishing until the top surface of the trench-filling oxide layer is positioned slightly over the liner oxide on the silicon wafer. The silicon wafer is then wet-cleaned, and thermally oxidized such that a pad oxide is grown at the surface of the silicon wafer.

The thickness of the liner oxide is established to be 150–400 Å, and that of the nitride to be 300–1000 Å. The thickness of the pad oxide is 100–200 Å.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or the similar components, wherein.

DETAILED DESCRIPTION OF THE EXEMPLARY EMBODIMENTS

The applicant claims priority to Korean Patent Application 99-10290, which is incorporated herein by reference.

Embodiments of this invention will be explained with reference to the accompanying drawings.

FIGS. 2A to 2E schematically illustrate the steps of processing a shallow trench for device isolation according to an embodiment of the present invention.

Figure 1A:
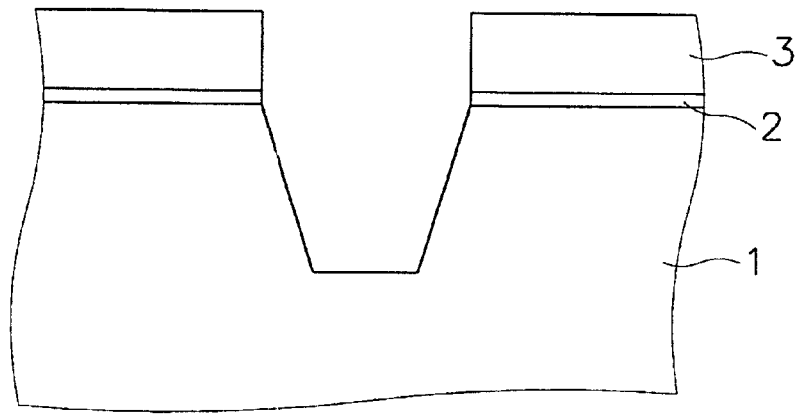
FIGS. 1A to 1D are schematic views illustrating the steps of processing a trench for device isolation according to a prior art method.
Figure 1B:
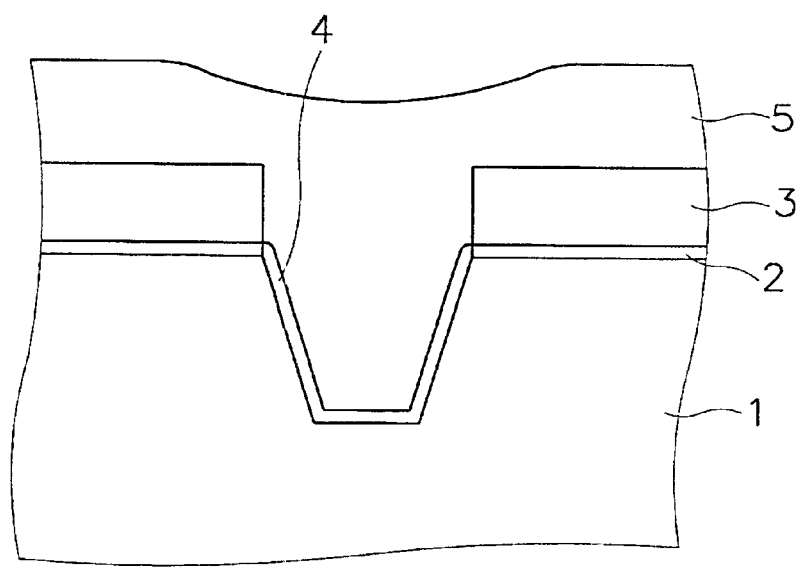
Figure 1C:
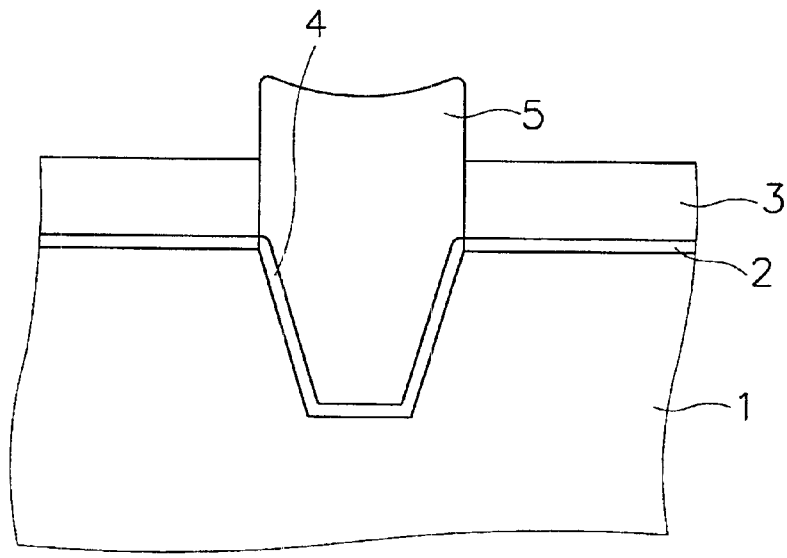
Figure 1D:
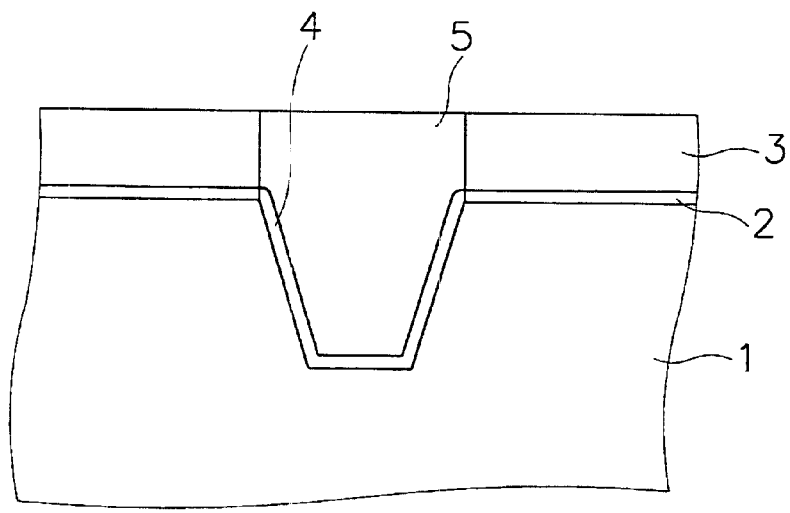
Figure 2A:
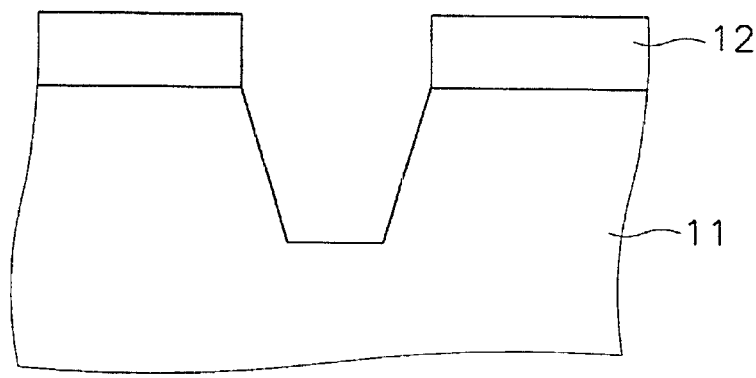
FIGS. 2A to 2E are schematic views illustrating the steps of processing a trench for device isolation according to an exemplary embodiment of the present invention.

As shown in FIG. 2A, a photoresist film is first coated onto a silicon wafer 11. The photoresist film is exposed to light through a patterning mask, and developed to thereby form a photoresist pattern 12. The silicon wafer 11 exposed through the photoresist pattern 12 is etched to thereby form a trench. It is preferable that the depth of the trench is in the range of 3000–6000 Å, and the ratio of the depth of the trench to its width is 1:1 or more.

Figure 2B:
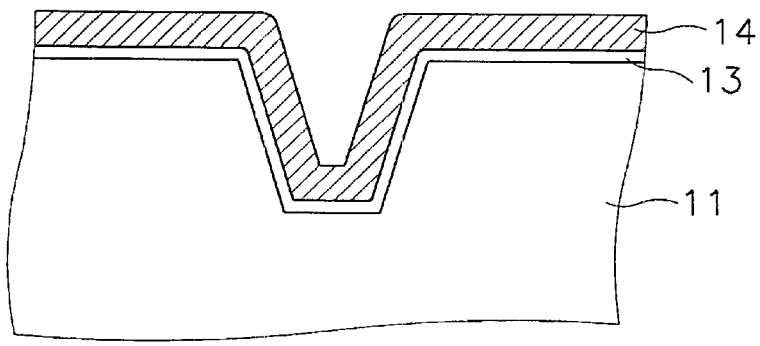

As shown in FIG. 2B, the photoresist pattern 12 is removed from the silicon wafer 11, and the silicon wafer 11 is cleaned. Thereafter, the silicon wafer 11 is thermally oxidized so that a liner oxide 13 with a thickness of 150–400 Å is grown at the inner wall of the trench as well as the entire surface of the silicon wafer 11. At this time, the liner oxide 13 functions as an insulating layer for initial device isolation at the inner wall of the trench, a protection film for the silicon wafer 11, and a glue layer for a trench-filling oxide that is subsequently formed using a chemical vapor deposition ("CVD") method. A layer of nitride 14 with a thickness of 300–1000 Å is then deposited onto the liner oxide 13 using a low-pressure CVD method.

Figure 2C:
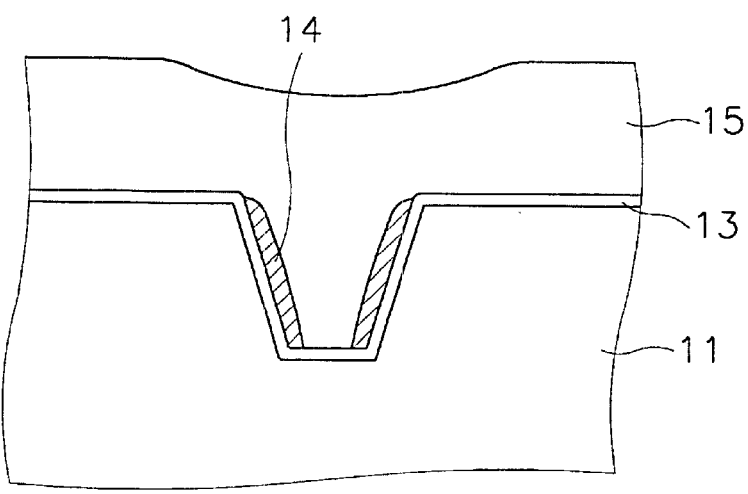

As shown in FIG. 2C, the nitride 14 is etched using a dry etching method, such as plasma etching. The dry etching is anisotropically performed with respect to the nitride 14 while being approximately normal to the surface of the silicon wafer 11. In this etching, the nitride 14 at the bottom wall of the trench is removed, but the nitride 14 at the sidewall of the trench remains. With this structure, impurities such as boron are not diffused even during subsequent thermal processing steps, and hence an electrical short or leakage of current can be effectively prevented, improving device reliability.

Thereafter, the aforementioned trench-filling oxide 15 with a thickness of 8000–11000 Å is deposited onto the entire surface of the silicon wafer 11 through a high-pressure CVD method such that the trench is completely buried by the trench-filling oxide 15. Considering that the trench-filling oxide 15 does not have sufficient insulating characteristics for device isolation in the deposited state alone, the trench-filling oxide 15 is annealed at 900–1000° C. for 20–50 minutes under a nitrogen gas atmosphere such that it can be densified to have the desired insulating characteristics.

Figure 2D:
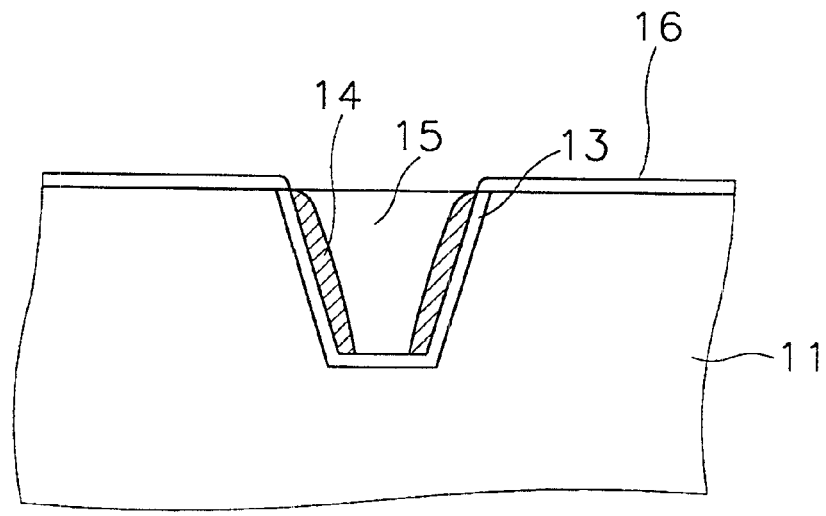

As shown in FIG. 2D, the trench-filling oxide 15 is planarized through time-controlled chemical mechanical polishing such that the top surface of the trench-filling oxide 15 is positioned above the level of the liner oxide 13 on the silicon wafer 11 by 100–500 Å. The planarization is realized at the whole area of the trench-filling oxide 15 so that the torn oxide phenomenon can be previously prevented. The liner oxide 13 remaining at the top surface of the silicon wafer 11 is removed through wet cleaning.

Figure 2E:
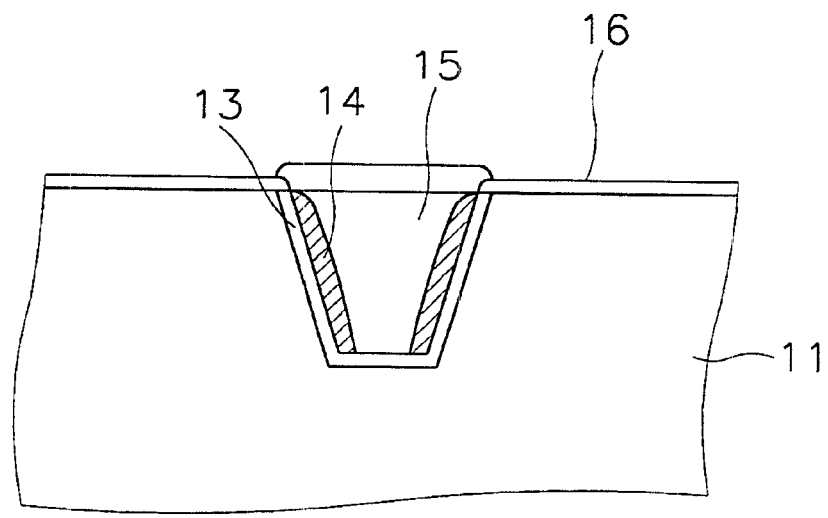

As shown in FIG. 2E, the silicon wafer 11 is thermally oxidized such that a pad oxide 16 is grown on the surface of the silicon wafer 11. At this time, the trench-filling oxide 15 is also grown so that a bird's beak is formed at the top edge of the trench to thereby prevent a gate oxide from thinning in the later steps for device fabrication. In this way, the formation of a shallow trench for device isolation is completed.

As described above, in the inventive trench formation method, the number of processing steps can be reduced without obtaining the torn oxide phenomenon, and device reliability can be ensured at reduced production cost.

While the present invention has been described in detail with reference to the above-described embodiments, those skilled in the art will appreciate that various modifications and substitutions can be made thereto without departing from the spirit and scope of the present invention as set forth in the appended claims.

I claim:
1. A method of forming a trench for semiconductor device isolation, the method comprising:
   making a trench at a device isolation area of a silicon wafer by etching the silicon wafer through a mask pattern, said trench having sidewalls;
   forming a liner oxide layer on the silicon wafer and within the trench through thermal oxidation;
   forming a nitride layer on the liner oxide layer through low pressure chemical vapor deposition, and anisotropically dry-etching the nitride layer such that the nitride is left only at the sidewalls of the trench;
   depositing a trench-filling oxide layer onto the entire surface of the silicon wafer through high pressure chemical vapor deposition, and annealing the trench-filling oxide layer;
   planarizing the trench-filling oxide layer through chemical mechanical polishing until a top surface of the trench-filling oxide is positioned slightly over the liner oxide layer on the silicon wafer, and wet-cleaning the silicon wafer; and
   thermally oxidizing the silicon wafer such that a pad oxide layer is grown at the surface of the silicon wafer.
2. The method of claim 1, wherein the thickness of the liner oxide layer is 150–400 Å.
3. The method of claim 2, wherein the thickness of the nitride layer is 300–1000 Å.
4. The method of claim 3, wherein the thickness of the pad oxide layer is 100–200 Å.
5. A method of forming a trench for semiconductor device isolation comprising the steps of:
   making a trench in a silicon wafer, said trench having sidewalls;
   forming a liner oxide layer on the silicon wafer and within the trench;
   forming a nitride layer on the liner oxide layer, and anisotropically dry-etching the nitride layer such that the nitride remains only on the sidewall of the trench;
   depositing a trench-filling oxide layer onto the silicon wafer, and annealing the trench-filling oxide layer;
   polishing the trench-filling oxide layer until a planarized top surface of the trench-filling oxide is just above the liner oxide layer;
   wet-cleaning the silicon wafer; and
   forming a pad oxide layer at the surface of the silicon wafer.
6. The method of claim 5, wherein the thickness of the liner oxide layer is 150–400 Å.
7. The method of claim 6, wherein the thickness of the nitride layer is 300–1000 Å.
8. The method of claim 7, wherein the thickness of the pad oxide layer is 100–200 Å.
9. The method of claim 5, further comprising growing the trench oxide so as to form a bird's beak.

* * * * *